(12) United States Patent
Hadley et al.

(10) Patent No.: US 9,057,767 B2
(45) Date of Patent: Jun. 16, 2015

(54) LINEAR PHASE MICROSTRIP RADIO FREQUENCY TRANSMIT COILS

(75) Inventors: J. Rock Hadley, Centerville, UT (US); Dennis L. Parker, Centerville, UT (US); Glen R. Morrell, Salt Lake City, UT (US)

(73) Assignee: The University of Utah, Salt Lake City, UT (US)

( * ) Notice: Subject to any disclaimer, the term of this patent is extended or adjusted under 35 U.S.C. 154(b) by 497 days.

(21) Appl. No.: 13/465,864

(22) Filed: May 7, 2012

(65) Prior Publication Data
US 2012/0280685 A1 Nov. 8, 2012

Related U.S. Application Data

(60) Provisional application No. 61/518,507, filed on May 7, 2011.

(51) Int. Cl.
*G01V 3/00* (2006.01)
*G01R 33/345* (2006.01)
*G01R 33/34* (2006.01)
*G01R 33/3415* (2006.01)

(52) U.S. Cl.
CPC ............ *G01R 33/3456* (2013.01); *G01R 33/34* (2013.01); *G01R 33/34076* (2013.01); *G01R 33/3415* (2013.01)

(58) Field of Classification Search
CPC ....................................................... G01R 33/34
USPC .......................... 324/318, 322, 306, 307, 309
See application file for complete search history.

(56) References Cited

U.S. PATENT DOCUMENTS

| | | | | |
|---|---|---|---|---|
| 6,252,403 | B1 * | 6/2001 | Alsop ........................... | 324/318 |
| 6,995,561 | B2 * | 2/2006 | Boskamp et al. ............. | 324/318 |
| 7,023,209 | B2 * | 4/2006 | Zhang et al. .................. | 324/318 |

\* cited by examiner

*Primary Examiner* — Louis Arana
(74) *Attorney, Agent, or Firm* — Norton Rose Fulbright US LLP

(57) ABSTRACT

Systems, devices and methods provide an RF coil which produces a field having linear phase variation across an imaging volume. In one embodiment, a coil comprises multiple microstrip elements configured to have an increased effective electrical length. This increase in electrical length allows for a larger linear phase shifts over the length of the microstrip element which in turn increases linear phase variation capabilities. This may be accomplished by increasing the effective dielectric properties of the microstrip element. Increasing the effective dielectric may be accomplished by utilizing distributed capacitors along the length of a microstrip element (e.g. lumped element capacitors), by altering the materials used to fabricate the microstrip element, etc. Additionally, increasing the effective dielectric may be accomplished using a combination of these means. Embodiments may further enable linear phase variation along the imaging volume at high frequencies, such as frequencies utilized for 3 T and above MRI devices.

23 Claims, 7 Drawing Sheets

LINEAR PHASE MICROSTRIP RADIO FREQUENCY TRANSMIT COILS

CROSS-REFERENCE TO RELATED APPLICATIONS

This application claims priority to U.S. Provisional Patent Application No. 61/518,507 filed on May 6, 2011, the disclosure of which is incorporated herein by reference.

TECHNICAL FIELD

The present application is related to imaging a target volume utilizing magnetic resonance imaging techniques, and more specifically to RF transmit coils utilized in such techniques.

BACKGROUND

Magnetic resonance imaging (MRI) is a common modality for imaging joints and other parts of the body due to its excellent definition of ligaments, cartilage, bone, muscle, fat and superior soft tissue contrast. MR techniques are utilized in multiple applications to determine whether structural defects are present in a target being imaged.

When a substance, such as human tissue, is subjected to a uniform magnetic field, the individual magnetic moments of the spins in the tissue attempt to align with this polarizing field, but precess about it in random order at their characteristic Larmor frequency. If the substance, or tissue, is subjected to a magnetic field that is in the x-y plane, and which is near the Larmor frequency, the net aligned moment, or "longitudinal magnetization," may be rotated, or "tipped," into the x-y plane to produce a net transverse magnetic moment. A signal is emitted by the excited spins after the excitation signal is terminated, and this signal may be received and processed to form an image.

In order to produce the magnetic fields used in MRI applications, Radio Frequency (RF) coils are utilized to generate the required magnetic fields to accomplish the above functionality. In general, RF coils for MRI attempt to produce a uniform field in the target volume which is uniform in both amplitude and phase because such properties provide for an image with reduced artifacts. Generally in RF coil design, providing linear phase variations along the imaging volume is not a primary concern. This is particularly true with respect to microstrip RF coil designs which do not utilize such a coil to produce a linear phase variation.

One previous attempt of designing an RF coil which produces linear phase variation is a twisted birdcage coil design. In this design, an existing RF coil type (birdcage coil) is taken and twisted, causes the phase in the x-y plane (the useful plane for imaging purposes) to vary as a function of position in the z direction (along the axis of the coil). However, this design has multiple drawbacks. For example, while the actual twisting of the twisted birdcage coil allows for the linear phase variation properties in the x-y plane, the twist in the coil increases the field in the z-direction. As a result, a large field in the z-direction is created when achieving any significant linear phase variation properties. A large field in the z-direction is undesirable because it deposits additional power within the target object being imaged, while not providing meaningful assistance with the actual imaging. When high power deposition is present, the entire imaging process must slow down in order to avoid excessive heating of the target object. The twisted birdcage coil also relies on two end rings at each end of the coil. These rings have very high electric fields associated with them which will cause additional power deposition to take place in the target object in an area proximate to the end rings.

BRIEF SUMMARY

The present application provides for systems, devices and methods which allow for an RF coil which produces a field having linear phase variation across an imaging volume. In one embodiment, a coil comprises multiple microstrip elements wherein the microstrip elements are configured to have an increased effective electrical length (and corresponding shorter wavelength). This increase in effective electrical length allows for larger linear phase shifts over the length of the microstrip element, which in turn increases linear phase variation capabilities.

Embodiments may increase the effective electrical length of a microstrip element by increasing the effective dielectric properties of the microstrip element. Increasing the effective dielectric properties may be accomplished by utilizing distributed capacitors along the length of a microstrip element (e.g. lumped element capacitors), by altering the materials used to fabricate the microstrip element, and the like. Additionally, increasing the effective dielectric may be accomplished using a combination of these means.

In some embodiments, an RF coil may utilize a plurality of microstrip elements disposed in a twisted configuration. Such a configuration provides for increased linear phase variation properties while minimizing undesirable magnetic and electric field components.

Embodiments may further utilize microstrip lines that are resistively terminated. Such a resistive termination may be implemented in a manner wherein the microstrip lines provide a non-resonant travelling wave medium to signals propagated through the microstrip line.

Embodiments may further enable linear phase variation along the imaging volume at high frequencies, such as frequencies utilized for 3 T and above MRI devices. This may be accomplished while maintaining minimal undesirable field components, thereby reducing power deposition into the imaging target.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
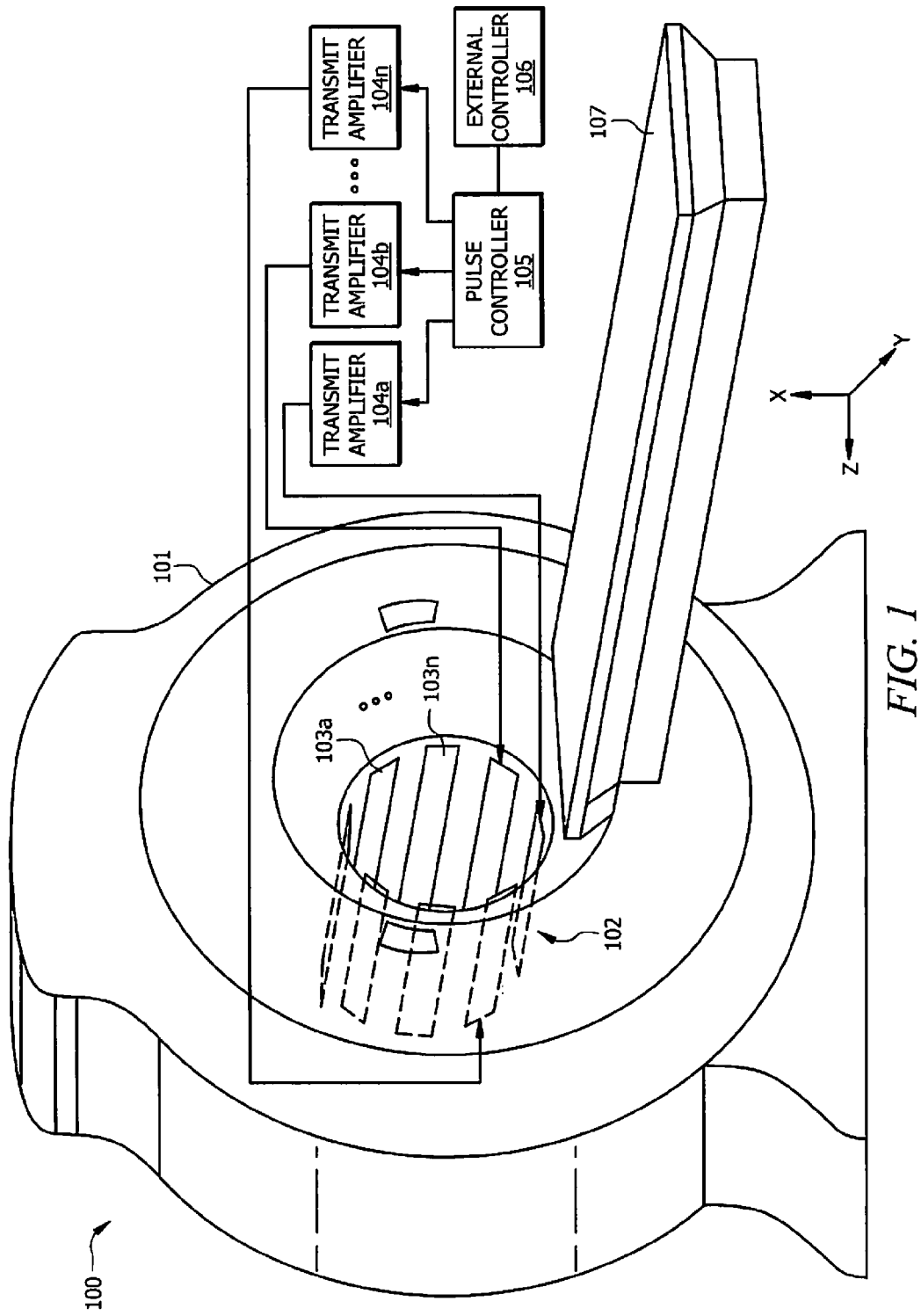
FIG. 1 illustrates an MRI imaging system in accordance with an embodiment of the present application.

FIG. 1 illustrates an MRI imaging system 100 in accordance with an embodiment of the present application. Imaging system 100 includes a housing 101 which contains a plurality of coils configured to implement MR imaging. Imaging system 100 includes a linear phase transmit coil 102 which includes a plurality of microstrip elements 103a-103n. Microstrip elements 103a-103n of linear phase transmit coil 102 may be driven by a plurality of transmit amplifier circuits 104a-104n which are controlled by a pulse controller circuitry 105. The control circuitry of imaging system 100 may be connected to an external controller 106 or processor which facilitates control over imaging system 100 as a whole.

In use, imaging system 100 may include scan table 107 whereupon an imaging target, such as a human patient, may be placed in order to allow for transmit coil 102 to induce a field within the target. With the target in place, linear phase transmit coil 102 induces a transverse magnetic field within the target having uniform amplitude and a substantially linear phase variation across the imaging volume of the target. Providing this linear phase variation allows for improvements over previous systems by providing for improvements in, e.g., parallel transmission techniques which may result in lower magnetic field components in the z-direction of the target and lower electric fields in all directions (and therefore lower power deposition into the target), improved specific absorption rate (SAR), and the like.

Signals received from the target volume are received by separate receive coils (not shown). These signals are then sent to an external processing device for image reconstruction processing in order to produce a resulting image.

It is noted that RF transmit coil 102 in this embodiment is a non-resonant coil. Such a coil may be resistively terminated so that the power propagated through a microstrip element is dissipated at the end of the element. Previous uses of microstrip elements to create RF coils for MR imaging have utilized terminations at the ends of the microstrip elements in such a way that a standing wave/resonant coil architecture is established. This is done because such RF coils utilize the coil as a transmit and receive coil. When using an RF coil as a receive coil, sensitivity becomes important because the received signals from the target are used for later image reconstruction. Such a resonant architecture, as utilized in the prior art, does not provide for linear phase variation across a target volume.

Figure 2A:
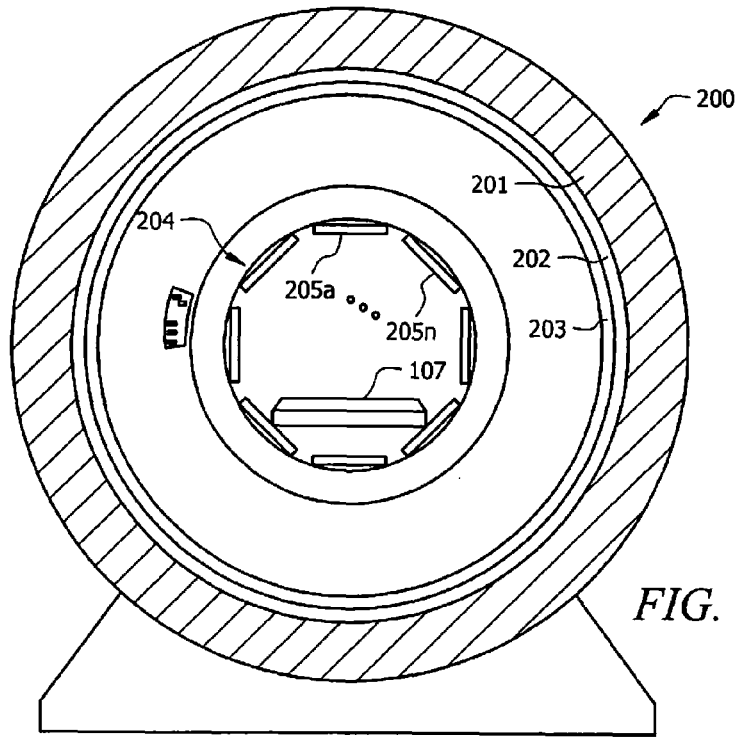
FIG. 2A illustrates a front cut away view of an MRI imaging system in accordance with an embodiment of the present application.

FIG. 2A illustrates a front cut away view of an MRI imaging system 200 in accordance with an embodiment of the present application. System 200 includes a main magnet 201. Main magnet 201 may be implemented by any means which provides for the functionality of MRI imaging system 200. Generally, main magnet 201 will be an electromagnet comprising superconducting wire windings which, when activated, will generate a magnetic field (typically in the 1.5 T-3.0 T range).

System 200 includes one or more gradient coils 202. Gradient coils 202 produce variations or gradients in the magnetic field produced by main magnet 201. The variation in the magnetic field due to gradient coils 202 permits localization of image slices as well as phase encoding and frequency encoding. Typically, an MRI imaging system, such as system 200, will include three sets of gradient coils, one for each direction.

System 200 also includes one or more RF receive coils 203. RF receive coils 203 detect the transverse magnetization as it precesses in the x-y plane from the target. As stated above, some embodiments utilize an RF receive coil which is separate from a transmit coil.

One or more linear phase transmit coils 204 are also provided. Such coils may be implemented as described above with respect to FIG. 1. As can be seen, a linear phase transmit coil 204 may include a plurality of elements 205a-205n. These elements may act in conjunction to create the magnetic field which tips the magnetic dipole moments produced by main magnet 201 in order to generate a signal which may be utilized in image reconstruction.

Figure 2B:
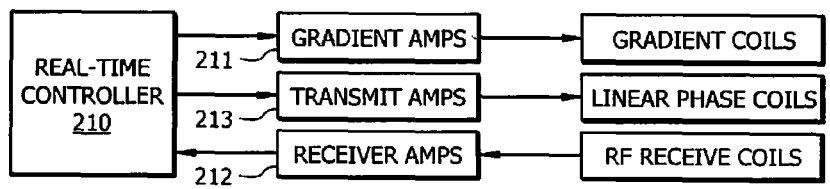
FIG. 2B illustrates a portion of the control circuitry which facilitates the functionality of driving gradient coils, RF receive coils and the linear phase transmit coil.

FIG. 2B illustrates a portion of the control circuitry which facilitates the functionality of driving gradient coils 202, RF receive coils 203 and linear phase transmit coil 204. The control circuitry comprises a real-time controller 210 coupled to a plurality of amplifiers which is functional to transmit control signals to facilitate the transmission and reception of fields in the MRI system. Real-time controller 210 provides control signals to gradient amplifiers 211 in order to excite one or more gradient coils 202 in order to produce desired gradient fields within a primary magnetic field. Real-time controller 210 further provides control signals to receiver amplifiers 212 which are configured to receive input signals from RF receive coils 203. These receive inputs are amplified by receiver amplifiers 212 in order to provide an amplified signal which may be later processed in order to reconstruct an image.

Real-time controller 210 is also configured to provide control signals to transmit amplifiers 213 which are utilized to drive phase coils 204. Transmit amplifiers 213 may comprise a plurality of amplifiers which are dedicated to driving one or more of elements 205a-205n. Real-time controller 210 is further configured to provide control signals to transmit amplifiers 213 which will excite elements 205a-205n in a manner to provide transverse magnetic fields with uniform amplitude having substantially linear phase variation across the imaging target volume.

Figure 3:
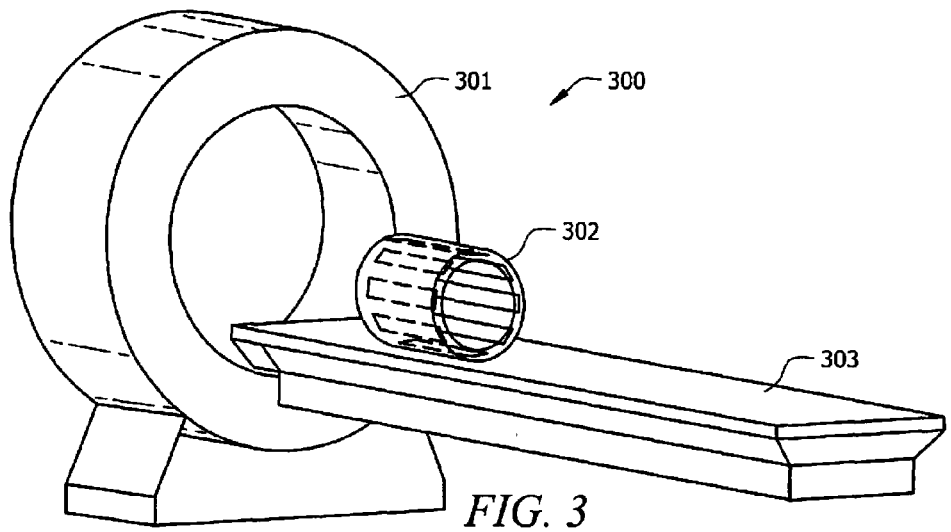
FIG. 3 illustrates an extremity coil implementation in accordance with an embodiment of the present application.

It is noted that while the above embodiments illustrate a transmit coil which is contained within the main housing of an MRI device, embodiments are not limited to such implementations. For example, FIG. 3 illustrates an extremity coil implementation in accordance with an embodiment of the present application. In this embodiment, MRI system 300 includes a main housing 301 which may include a main driving coil, gradient coils, receive coils, and the like. System 300 also includes a linear phase extremity transmit coil 302 placed upon a scanning surface 303. Such an extremity coil may be useful in applications where smaller portions of the target volume are imaged. For example, in the event that only a portion of the human patient needs to be imaged, such as a portion of an arm or leg, the patient may insert the relevant target volume within extremity transmit coil 302 which allows for the patient to experience less exposure to fields produced by MRI system 300.

Figure 4A:
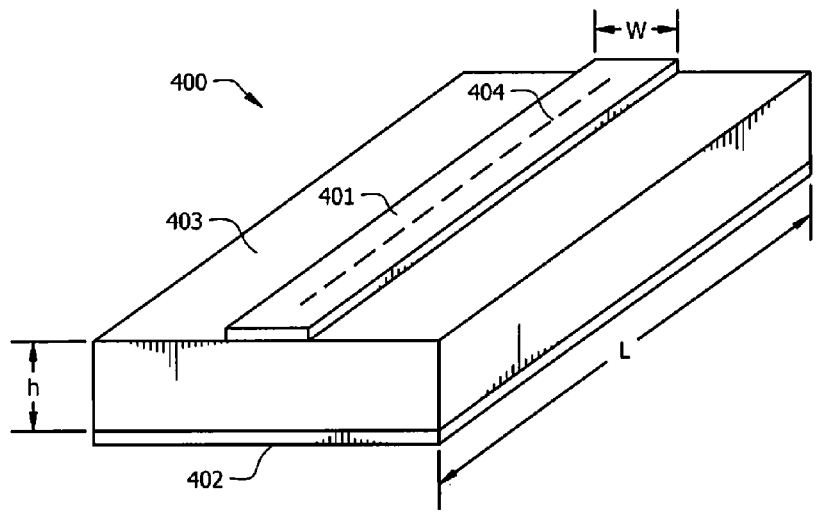
FIG. 4A illustrates a microstrip line which is utilized to function as an element in a linear phase microstrip RF transmit coil in accordance with an embodiment of the present application.

FIG. 4A illustrates a microstrip line 400 which is utilized to function as an element in a linear phase microstrip RF transmit coil in accordance with an embodiment of the present application. Microstrip line 400 includes center conductor 401 and secondary conductor or ground plane 402, which is separated by substrate region 403. Microstrip line 400 has a length L, center conductor 401 has a width w, while substrate region 403 has a height h and a dielectric value $\epsilon_r$. Each of these dimensions impacts the performance and functionality of microstrip line 400.

Figure 4B:
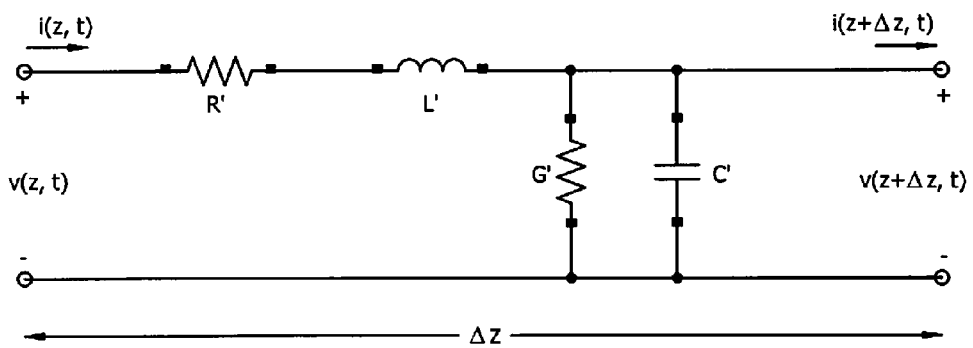
FIG. 4B illustrates an equivalent circuit model for microstrip line of FIG. 4A.

FIG. 4B illustrates an equivalent circuit model for microstrip line 400 of FIG. 4A. R' represents a resistance value per unit length of the line, L' represents an inductance value per unit length of the line, C' represents capacitance per unit length of the line and G' represents conductivity and per unit length of the line. In general, characteristic impedance of a microstrip line may be represented by the following equations:

$$Z_0 = \sqrt{\frac{R' + j\omega L'}{G' + j\omega C'}} \text{ standard } T\text{-line}$$

$$Z_0 = \sqrt{\frac{L'}{C'}} \text{ lossless } T\text{-line}$$

where $Z_0$ represents the characteristic impedance of the transmission line and $\omega$ equals $2\pi*$frequency transmitted in the line.

The electrical line length of a microstrip line in a vacuum is represented by the following equations:

$$\lambda = \frac{c}{f}, \text{ where } c = \frac{1}{\sqrt{\epsilon_0 \mu_0}}$$

In a dielectric, the electrical length of microstrip line is represented as follows:

$$\lambda = \frac{c}{f\sqrt{\epsilon_r}}, \text{ where } c = \frac{1}{\sqrt{\epsilon_0 \epsilon_r \mu_0}}$$

where c is the speed of light, $\epsilon_0$ is free space permittivity, $\mu_0$ is free space permeability, f is frequency and $\epsilon_r$ is the dielectric constant of the substrate. As can be seen, the wavelength of the microstrip line in a dielectric decreases by factor of:

$$\frac{1}{\sqrt{\epsilon_r}}$$

with respect to a microstrip line in a vacuum. Accordingly, altering the effective dielectric constant of a microstrip line allows for the manipulation of the electrical length of a microstrip line. Shortening the effective wavelength (lengthening the effective electrical length) of the microstrip line allows embodiments of the present application to achieve linear phase variation across the length of an RF coil.

The effective dielectric constant of a microstrip line may be calculated with the following equation:

$$\epsilon_{eff} = \frac{\epsilon_r + 1}{2} + \frac{\epsilon_r - 1}{2} \frac{1}{\sqrt{1 + 12h/w}}$$

and characteristic impedance may be approximated with the following:

$$Z_0 = \begin{cases} \frac{60}{\sqrt{\epsilon_{eff}}} \ln\left(\frac{8h}{W} + \frac{w}{4h}\right) & \text{for } w/h \leq 1 \\ \frac{120}{\sqrt{\epsilon_{eff}} [w/h + 1.393 + 0.667\ln(w/h + 1.444)]} & \text{for } w/h \geq 1 \end{cases}$$

Accordingly, for a known $Z_0$ and $\epsilon_r$, a width over height ratio for a microstrip line may be derived using the following:

$$\frac{w}{h} = \begin{cases} \frac{8e^A}{e^{2A} - 2} & \text{for } w/h < 2 \\ \frac{2}{\pi}[B - 1 - \ln(2B - 1) + \\ \frac{\epsilon_r - 1}{2\epsilon_r}\left\{\ln(B - 1) + 0.39 - \frac{0.61}{\epsilon_r}\right\}] & \text{for } w/h > 2 \end{cases}$$

where $A = \frac{Z_0}{60}\sqrt{\frac{\epsilon_r + 1}{2}} + \frac{\epsilon_r - 1}{2\epsilon_r}\left(0.23 + \frac{0.11}{\epsilon_r}\right)$ $$B = \frac{377\pi}{2Z_0\sqrt{\epsilon_r}}.$$

As a result, design parameters for a microstrip line can be readily determined and it can be seen that increasing the dielectric value of the substrate decreases the wavelength of a signal transmitted in the microstrip line (thereby increasing the effective line length). However, substrates with high dielectric values are typically lossy and expensive. As such, achieving linear phase variation along the length of an RF transmit coil by simply increasing the dielectric value of a substrate of a microstrip line, alone, may not be practical in all implementations.

In some embodiments, multiple materials may be utilized for the substrate. For example, embodiments may include multiple layers of dielectric materials, dispose materials having a higher dielectric than s substrate material at pre-determined locations (e.g. include stripes or other deposits of secondary materials along the length of the substrate), and the like.

Because of this, embodiments may add capacitance to the microstrip line. Such an addition decreases the characteristic impedance of the line, which effectively decreases the wavelength of a wave propagation through the line and increases the effective electrical line length.

Figure 5:
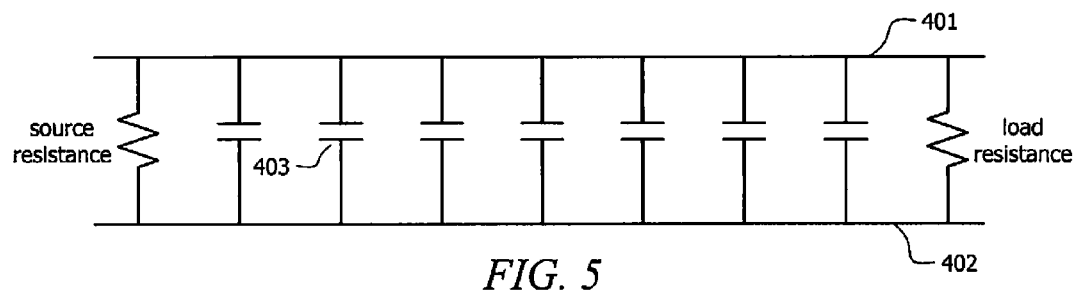
FIG. 5 illustrates a circuit model of a microstrip line which includes added capacitance in accordance with an embodiment of the present application.

As illustrated in FIG. 4A, microstrip line 400 includes a plurality of capacitors 404 disposed along the length of microstrip line 400. FIG. 5 illustrates a circuit model of microstrip line 400 which includes added capacitance. As can be seen, a plurality of shunt capacitors 404 are disposed between center conductor 401 and ground plane 402. In one embodiment, shunt capacitors 404 may be implemented by utilizing lumped element capacitors. In the illustrated embodiment, microstrip line 400 is resistively terminated at both ends. Such a termination may be configured to provide a non-resonant traveling wave which propagates through microstrip line 400.

It is noted that while the illustrated embodiment utilizes shunt capacitors, any other means which provides for increased capacitance, and therefore providing for an increased effective length of the microstrip line, may be utilized. Further, embodiments are not limited by the number of capacitors used, the distribution of the capacitors, and the like. Moreover, when attempting to increase the electrical length of the line, a combination of added capacitors and using materials with increased epsilon values may be utilized. Accordingly, it is appreciated that different designs may be implemented while utilizing the concepts disclosed in the present application.

Figure 6:
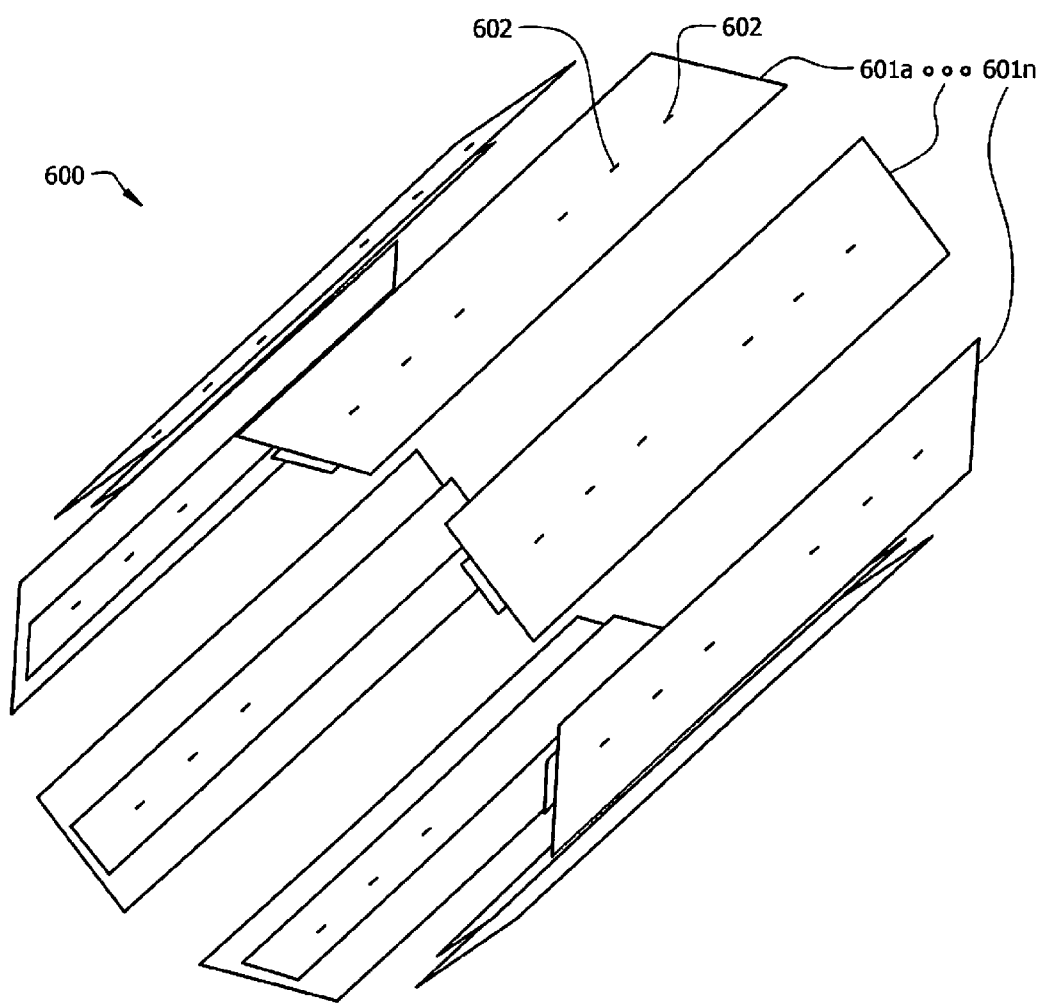
FIG. 6 illustrates a microstrip coil in accordance with an embodiment of the present application.

FIG. 6 illustrates a microstrip coil 600 in accordance with an embodiment of the present application. Microstrip coil 600 comprises a plurality of microstrip elements 601a-601n. In the illustrated embodiment, eight microstrip elements are utilized. However, it is noted that embodiments may utilize more or less elements depending on particular design requirements or desired outcomes for particular applications. Microstrip elements 601a-601n include additional capacitance elements 602 which are disposed along the length of each microstrip element.

In order to further illustrate the performance of a microstrip coil in accordance with embodiments of the present application, an example implementation and corresponding results are provided. It is noted, however, that this implementation is provided by way of example and is not intended to limit the scope of the present invention.

An RF microstrip coil, such as coil 600, was implemented in simulation having a coil length of 40 cm and coil volume diameter of 24 cm. Eight microstrip elements were utilized having where w=25 mm, h=5 mm and the width of the ground plane was 60 mm. The microstrip elements included 7 shunt capacitors centered evenly along the length of the microstrip line. The dielectric constant of the substrate was 2.4 (Teflon), and $Z_0$ equaled 34 ohms.

Figure 7A:
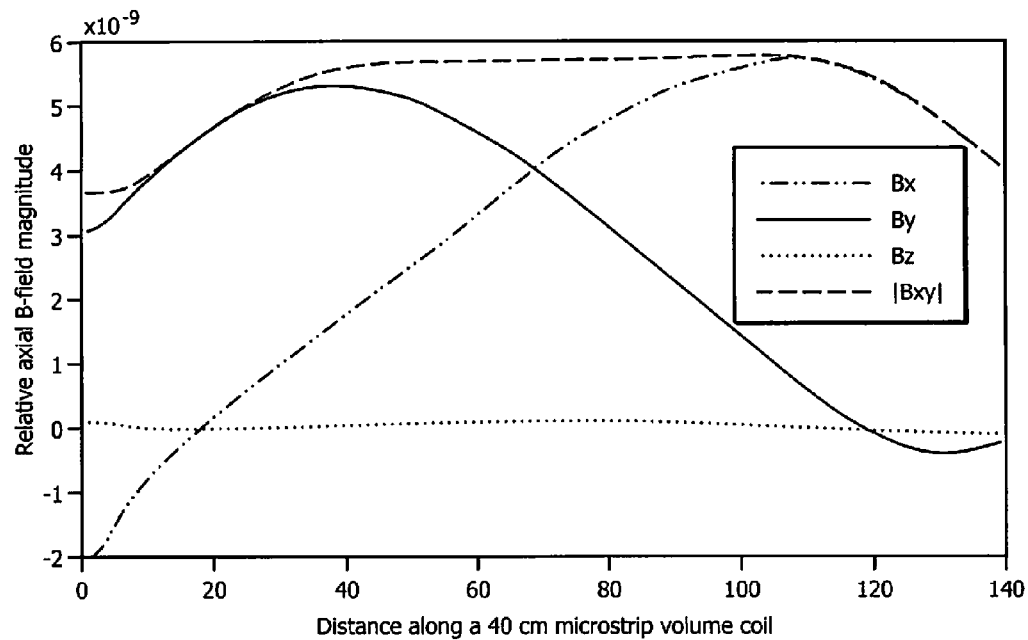
FIG. 7A illustrates the magnetic field produced by the embodiment illustrated in FIG. 6 along a single line in the center of the coil volume, showing relative magnetic field magnitude per-unit of distance along the length of the example microstrip coil.

FIG. 7A illustrates axial field profiles which plot the relative magnetic field per-unit of distance along the length of the example microstrip coil. Respective lines are shown for the magnetic field component in the x-plane "Bx," in the y-plane "By," and the z-plane "Bz." Additionally, a line is plotted which illustrates the magnitude of the x-y components, "|Bxy|." As can be seen, the example RF microstrip coil provides a magnitude of the magnetic field in the x-y plane that is relatively constant throughout the length of the microstrip line. Further, it is shown that there is very little field strength in the z-plane.

Additionally, as can be seen, the Bx and By field components are changing sinusoidally out of phase with each other. Accordingly, if one were to observe the magnetization vector in the x-y plane as it moves down the coil, the vector would move around in a circular motion. This phenomenon produces the desired linear phase variation properties.

It is noted that the coil dimensions are substantially smaller than the wavelength of the signals propagating through the microstrip line. For example, MRI systems utilize frequencies having wavelengths around 2.5 meters in length, whereas the example RF coil is only 40 cm. Despite these differences, the illustrated example coil has been able to yield approximately a 168° phase variation along the center of the coil where it would normally take a coil length between 1.5-2.0 meters to accomplish the same phase variation.

Figure 7B:
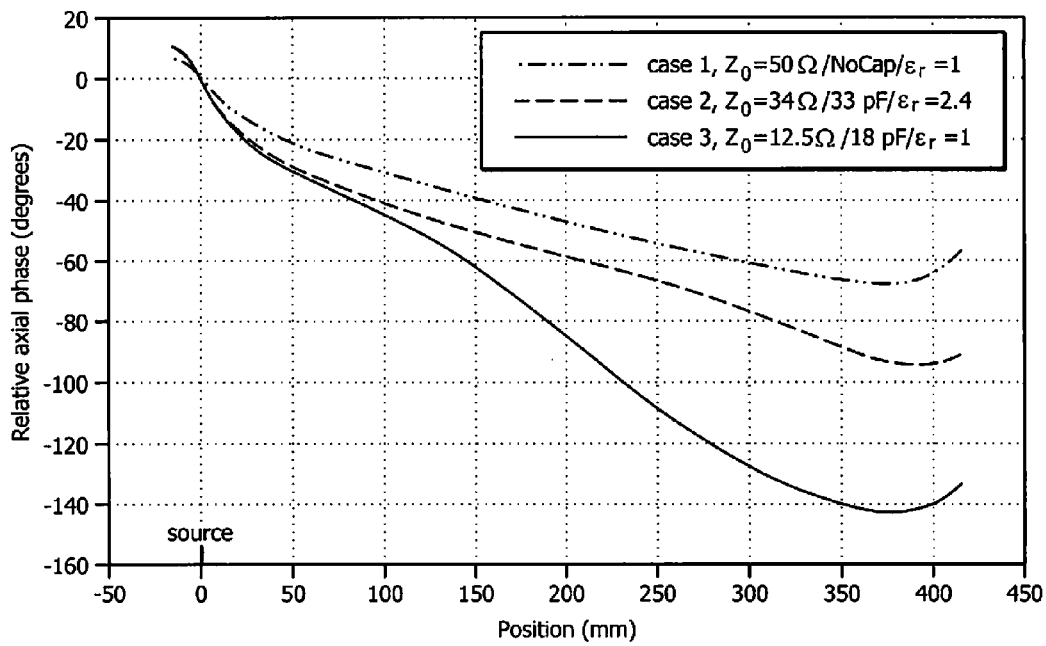
FIG. 7B illustrates the linear phase in the x-y plane as a function of location in z (along the length of the coil) for three different example RF coils which differ in substrate dielectric properties and in amounts of lumped capacitance.

FIG. 7B illustrates a plot of the phase of the magnetic field in the x-y plane of three different example RF coils. Each RF coil was resistively terminated and three different cases were analyzed where the microstrip elements had different impedance, capacitance and dielectric properties. It is notable that in the first case, where no additional capacitors are utilized, a somewhat linear phase variation is accomplished. Such an embodiment has not been previously contemplated, as current MRI systems do not utilize resistively terminated non-resonant microstrip lines. Further, as can be seen altering impedance values, capacitance values and dielectric values provides for significant changes in linear phase variation properties.

Figure 8:
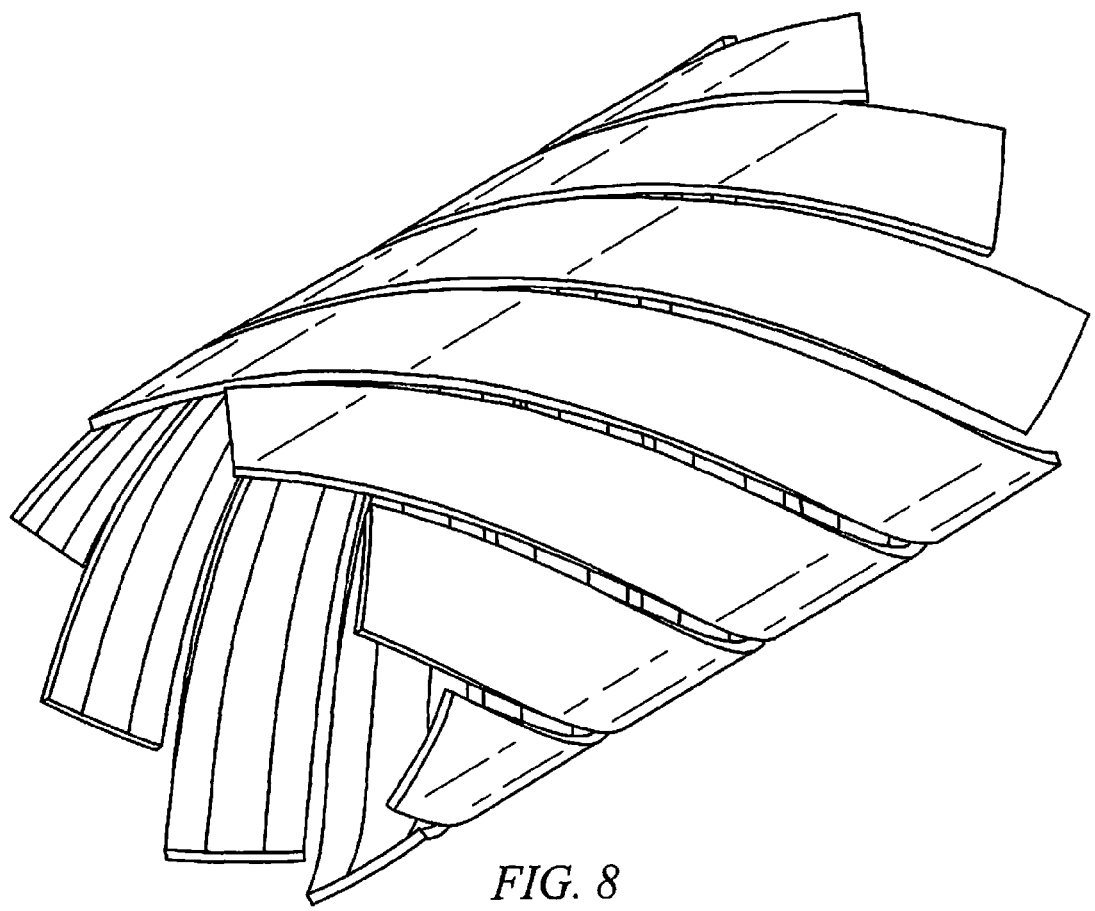
FIG. 8 illustrates a microstrip coil in accordance with an embodiment of the present application in which the microstrips have been twisted to increase the linear phase along the length of the coil.

FIG. 8 illustrates a microstrip coil 800 in accordance with an embodiment of the present application. Microstrip coil 800 comprises a plurality of microstrip elements 801a-801n. In the illustrated embodiment, eight microstrip elements are utilized. However, it is noted that embodiments may utilize more or less elements depending on particular design requirements or desired outcomes for particular applications. Microstrip elements 801a-801n include additional capacitance elements, as discussed above, which are disposed along the length of each microstrip element. In this embodiment, microstrip elements 801a-801n are twisted. Such twisting provides for increased ability to accomplish linear phase variation across the length of the coil. As illustrated, elements 801a-801n of microstrip coil 800 experience a π twist, however it is noted that varying degrees of twisting may be utilized in accordance with various design choices or parameters that may be implemented.

An example implementation and corresponding results for a twisted RF microstrip coil embodiment are provided herein. As was the case above, this implementation is provided by way of example and is not intended to limit the scope of the present invention.

A twisted RF microstrip coil, such as coil 800, was implemented in simulation having a coil length of 40 cm and coil volume diameter of 24 cm. Eight microstrip elements were utilized having a π twist, where w=25 mm, h=5 mm and the width of the ground plane was 60 mm. The microstrip elements included 7 shunt capacitors centered evenly along the length of the microstrip line. The dielectric constant of the substrate was 2.4 (Teflon), and $Z_0$ equaled 34 ohms.

Figure 9:
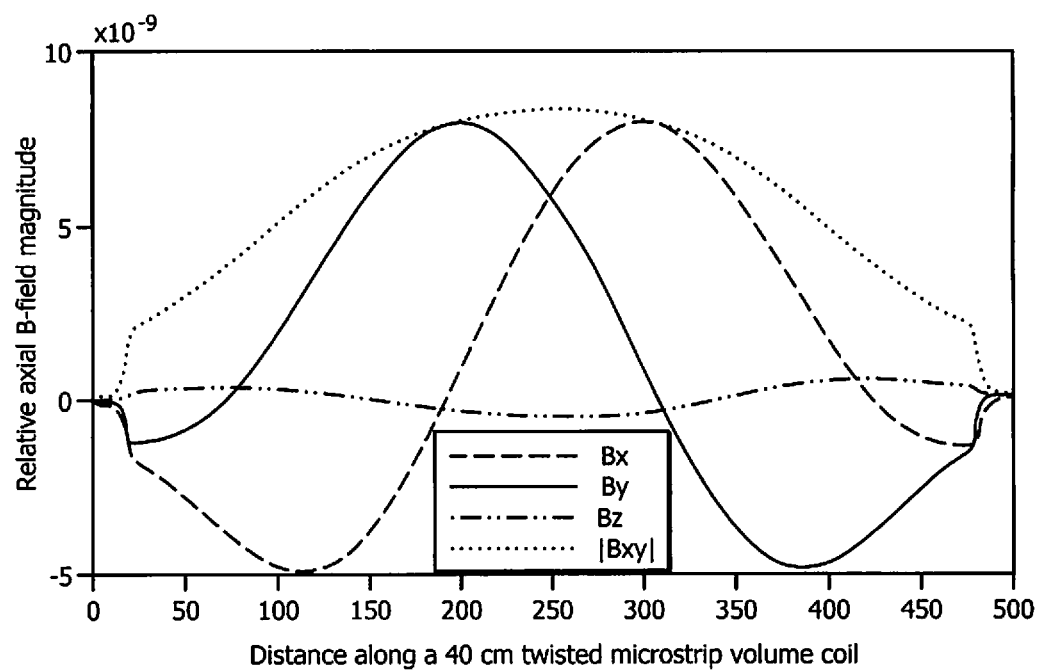
FIG. 9 illustrates plots the relative magnetic field magnitude in all three directions (x, y, and z) per-unit of distance along the length of the example microstrip coil shown in FIG. 8.

FIG. 9 illustrates a plot of the phase of the magnetic field in the x-y plane per-unit of distance along the length of the example microstrip coil. Respective lines are shown for the magnetic field component in the x-plane "Bx," in the y-plane "By," and the z-plane "Bz." Additionally, a line is plotted which illustrates the magnitude of the x-y components, "|Bxy|." As can be seen, the example RF microstrip coil provides a magnitude of the magnetic field in the x-y plane that is relatively constant throughout the length of the microstrip line, although the magnitude profile is not as ideal as the straight RF coil embodiment. Further, it is shown that there is very little field strength in the z-plane.

Additionally, as can be seen, the Bx and By field components are changing sinusoidally out of phase with each other. Accordingly, if one were to observe the magnetization vector in the x-y plane as it moves down the coil, the vector would move around in a circular motion. In this embodiment, the Bx and By field components nearly complete a full sinusoidal path. Accordingly, this embodiment achieves nearly a 360° phase shift along the length of the coil.

Figure 10:
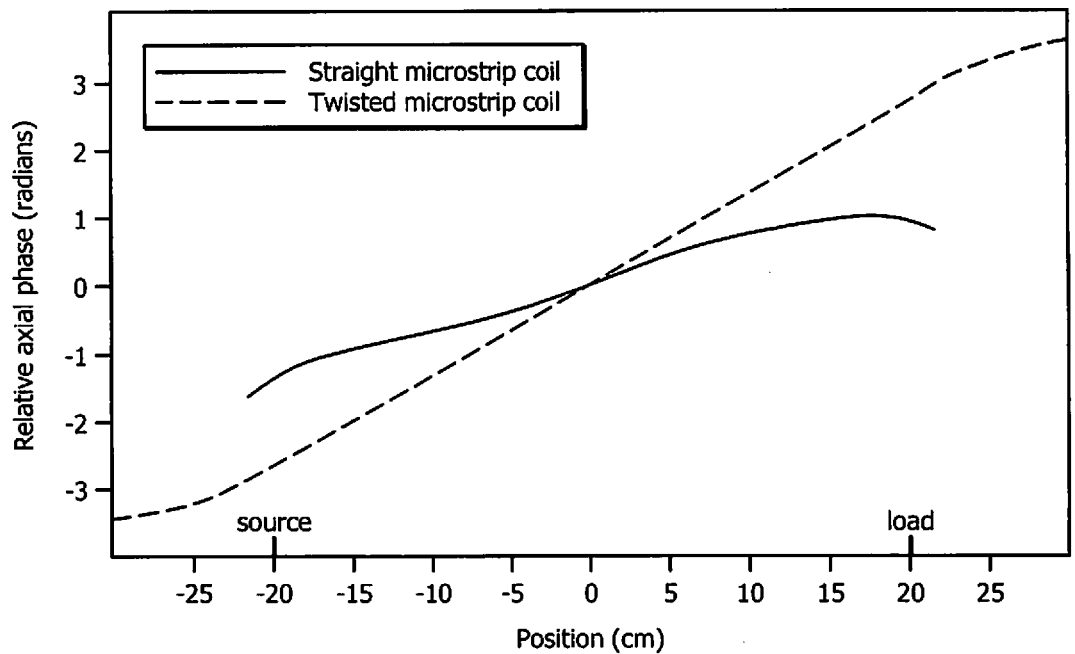
FIG. 10 illustrates an x-y plane phase profile comparison plot which compares the phase performance of the example straight and twisted RF microstrip coils.

FIG. 10 illustrates a plot of the phase of the magnetic field in the x-y plane which compares the phase performance of the example straight and twisted RF microstrip coils. As can be seen, both coils produce linear phase variation results. However, it can be seen that the twisted RF coil has improved linear phase variation properties over the straight RF coil embodiment.

It is further noted that embodiments described have been discussed in the context of a 3 T (123 MHz) MRI system where the frequencies propagating in the RF coils have wavelengths of about 2.5 meters. However, embodiments are not limited to such devices. In embodiments where a 4 T, 7 T or even a 9 T scanner is utilized, the frequencies in the wavelength decrease naturally. Utilizing embodiments of the present application in such systems becomes even more beneficial as linear phase variation is easier to accomplish because of the shortening of the wavelength. Further, power deposition concerns are more prevalent in such systems. Therefore, embodiments of the present application, which provide for relatively small magnetic field effects in the z-direction and small electric fields, provide significant advantages over present RF coil designs.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
    a main magnetic element configured to produce a magnetic field within a target volume;
    a radio frequency (RF) transmission coil configured to provide an RF pulse to the target volume which acts on the magnetic field, the RF transmission coil comprising:
        a plurality of microstrip elements, wherein the plurality of microstrip elements are configured to generate transverse magnetic fields having substantially uniform amplitude and linear phase variation across the target volume; and
        a receiving coil separate from the transmission coil, the receiving coil configured to receive signals propagating from the target volume,
    wherein the plurality of microstrip elements are configured to provide a non-resonant travelling wave medium.

2. The system of claim 1 wherein the plurality of microstrip elements are resistively terminated to provide the non-resonant travelling wave medium.

3. The system of claim 1 wherein the plurality of microstrip elements comprise one or more components configured to increase the effective electrical length of the individual microstrip elements.

4. The system of claim 3 wherein the one or more components include at least one capacitor.

5. The system of claim 4 wherein the one or more components comprises a plurality of lumped element capacitors disposed in a shunt configuration.

6. The system of claim 3 wherein the one or more components includes a dielectric substrate material having one or more regions with a higher dielectric constant value than the dielectric value of the substrate material.

7. The system of claim 1 wherein the plurality of microstrip elements are disposed in a twisted configuration.

8. The system of claim 7 wherein the microstrip elements are twisted by a factor of $\pi$.

9. The system of claim 1 wherein the main magnetic element is configured to produce at least a 3 T magnetic field.

10. The system of claim 1 wherein the RF coil is configured to produce minimal electric field components along the axis of the length of the RF coil.

11. The system of claim 1 wherein the RF coil is configured to be disposed in a main housing with the main magnetic element and receiving coil.

12. The system of claim 1 wherein the RF coil is configured to be disposed within an extremity imaging housing which is utilized with an magnetic resonance imaging system.

13. A magnetic resonance imaging apparatus comprising:
    a plurality of microstrip lines configured to be disposed in a coil configuration, said plurality of microstrip lines each including a plurality of capacitors disposed along the length of the microstrip lines, wherein said plurality of microstrip lines are further configured to propagate a radio frequency transmit signal into a target volume being imaged by said magnetic resonance imaging device, said transmit signal having a substantially linear phase variation across the length of the target volume, said linear phase variation achieved at least in part by extending the electrical length of the microstrip lines using said plurality of capacitors.

14. The magnetic resonance imaging apparatus of claim 13 wherein the plurality of microstrip lines are configured to be disposed in a twisted configuration.

15. The magnetic resonance imaging apparatus of claim 13 wherein the plurality of capacitors are lumped element capacitors.

16. The magnetic resonance imaging apparatus of claim 13 wherein the plurality of capacitors are disposed in a shunt configuration along the microstrip line.

17. The magnetic resonance imaging apparatus of claim 13 wherein the plurality of microstrip lines are resistively terminated.

18. The magnetic resonance imaging apparatus of claim 17 further comprising a receive coil configured to receive signals from the target volume.

19. A method comprising:
   generating a main magnetic field in a target volume;
   providing an RF pulse having a substantially linear phase variation along the length of the target volume to the generated main magnetic field within the target volume, said RF pulse provided by an RF coil comprising a plurality of microstrip elements; and
   receiving one or more signals from a target volume, said signals usable for image reconstruction to produce an internal image corresponding to the target volume.

20. The method of claim 19 wherein the substantially linear phase variation remains substantially linear across a 140-360 degree phase variation.

21. The system of claim 1 wherein the plurality of microstrip elements are disposed in a straight configuration.

22. The apparatus of claim 13 wherein the plurality of microstrip elements are disposed in a straight configuration.

23. The apparatus of claim 1 wherein the plurality of microstrip lines are excited by dedicated power source channels, each dedicated power source channel having the ability to independently adjust the a microstrip line of the plurality of microstrip lines in order to achieve the substantially uniform amplitude and linear phase variation across the target volume.

\* \* \* \* \*